(12) United States Patent
Plagne et al.

(10) Patent No.: US 10,996,245 B2
(45) Date of Patent: May 4, 2021

(54) FLUXGATE ELECTRICAL CURRENT TRANSDUCER

(71) Applicant: LEM INTELLECTUAL PROPERTY SA, Fribourg (CH)

(72) Inventors: Gauthier Plagne, Saint-Julien-en-Genevois (FR); Jérémie Piro, Pringy (FR)

(73) Assignee: LEM International SA, Plan-les-Ouates (CH)

( * ) Notice: Subject to any disclaimer, the term of this patent is extended or adjusted under 35 U.S.C. 154(b) by 82 days.

(21) Appl. No.: 16/341,518

(22) PCT Filed: Oct. 12, 2017

(86) PCT No.: PCT/EP2017/076130
§ 371 (c)(1),
(2) Date: Apr. 12, 2019

(87) PCT Pub. No.: WO2018/069475
PCT Pub. Date: Apr. 19, 2018

(65) Prior Publication Data
US 2019/0377009 A1    Dec. 12, 2019

(30) Foreign Application Priority Data

Oct. 14, 2016  (EP) .................................. 16193895

(51) Int. Cl.
*G01R 15/18*    (2006.01)
*G01R 33/04*    (2006.01)
*G01R 19/00*    (2006.01)

(52) U.S. Cl.
CPC ....... *G01R 15/185* (2013.01); *G01R 19/0092* (2013.01)

(58) Field of Classification Search
CPC ........ G01R 33/04; G01R 33/07; G01R 15/20; G01R 15/185; G01R 19/00; G01R 19/0092
See application file for complete search history.

(56) References Cited

U.S. PATENT DOCUMENTS

2012/0139527 A1\* 6/2012 Teppan ................. G01R 19/20
                                                                          324/127
2015/0042325 A1   2/2015 Snoeij

FOREIGN PATENT DOCUMENTS

JP         3099336      10/2000
JP       2013088284      5/2013
(Continued)

OTHER PUBLICATIONS

The International Search Report and Written Opinion of the International Searching Authority, dated Feb. 1, 2018, for International Patent Application No. PCT/EP2017/076130; 14 pages.

*Primary Examiner* — Minh N Tang
(74) *Attorney, Agent, or Firm* — Faegre Drinker Biddle & Reath LLP

(57) ABSTRACT

Fluxgate based current transducer for measuring a primary current flowing in a primary conductor, comprising a fluxgate magnetic field detector and a measuring circuit. The fluxgate magnetic field detector includes an excitation coil driven by an oscillating excitation current ($I_{fluxgate}$) supplied by the measuring circuit. The measuring circuit is configured to provide a first and a second measurement output of the oscillating excitation current. The transducer further comprises a signal output processing unit for comparing in real-time the first and second measurements outputs, wherein the signal output processing unit is configured to send an error signal output if the difference between said first and second measurements outputs exceeds a tolerance value.

21 Claims, 4 Drawing Sheets

(56) References Cited

FOREIGN PATENT DOCUMENTS

| JP | 2013213725 | 10/2013 |
|---|---|---|
| WO | WO 2016/002216 | 1/2016 |

\* cited by examiner

FLUXGATE ELECTRICAL CURRENT TRANSDUCER

CROSS-REFERENCE TO RELATED APPLICATIONS

The present application is a national stage entry of International (PCT) Patent Application Number PCT/EP2017/076130, filed Oct. 12, 2017, which in turn claims priority to European Patent Application No. 16193895.6, filed Oct. 14, 2016, the subject matter of which are expressly incorporated herein by reference.

The present invention relates to an electrical current transducer, of the fluxgate type, for measuring an electrical current.

Current transducers are implemented in numerous applications to monitor current and control electrically operated devices. Current transducers using magnetic field detectors of the fluxgate type are very accurate and do not suffer from problems of offset that many other transducers have, for instance transducers based on Hall effect detectors. A malfunctioning current transducer that nevertheless generates an incorrect measurement signal, or a measurement signal lying outside a range of acceptable error tolerance, may however not be noticed or may lead to faulty operation of systems based on the measurement value output by the current transducer. The control of many electrical systems rely on the output signal of current transducers. The performance and safety of electrically operated systems may therefore be adversely affected by inaccurate or faulty current transducers. In many conventional systems inaccurate or faulty measurement outputs may go unnoticed, or may be detected too late to avoid incorrect control of electrically operated systems leading to damage or other adverse consequences. In certain applications it may be important to detect a faulty measurement output very rapidly in order to correct the situation, for instance to switch to a fail safe mode of the electrically operated system.

In many critical systems, a second current transducer is installed, the second transducer providing a second redundant measurement output that allows to detect if one of the current transducers malfunctions. This is however a costly solution that also requires more space to install and consumes more power than a single transducer. Also, since two transducers are implemented, the risk of failure of one of them is increased.

There is a continuous desire to reduce assembly and operation costs of electrical systems, while increasing their performance and reliability and reducing their size, these aims affecting the components forming the electrical system.

It is an object of this invention to provide an electrical current transducer that is accurate and reliable, and in particular that allows detection of poor functioning or malfunction of the transducer, and/or that reduces the risks of a defective functioning.

It is advantageous to provide a current transducer that provides protection against malfunction of the transducer.

It is advantageous to provide a current transducer that is compact and economical to install in an electrical system.

It is advantageous to provide a current transducer that is economical to operate when installed in an electrical system.

It is advantageous to provide a current transducer that is economical to manufacture.

Various objects of this invention have been achieved by providing the fluxgate based current transducer according to the present disclosure.

Disclosed herein is a fluxgate based current transducer for measuring a primary current $I_P$, comprising a fluxgate magnetic field detector, a measuring circuit, and a signal output processing unit, the fluxgate magnetic field detector including an excitation coil driven by an oscillating excitation current ($I_{fluxgate}$) supplied by the measuring circuit. The measuring circuit is configured to provide at least two different measurement signals of the primary current ($I_P$), including a first measurement signal (S1) obtained through a first measurement signal path (P1) and a second measurement signal (S2) obtained through a second measurement signal path (P2). The first and second measurement signal paths are connected to the signal processing unit, the signal processing unit being configured to compare in real-time the first and second measurement signals, and to output an error signal if the difference between said first and second measurement signals exceeds a predefined tolerance value.

In an advantageous embodiment, the measuring circuit includes a first measurement circuit portion configured to generate, at a first measurement signal output of the first measurement circuit portion, the first measurement signal (S1) in the form of a pulse width modulated (PWM) signal of the excitation coil current ($I_{fluxgate}$).

In an embodiment, the transducer includes a timer module in the first measurement signal path, for instance in the form of an input capture circuit, configured to read and capture values of timing ($t_1$, $t_2$) of successive positive and negative PWM signal oscillations for processing in the signal processing unit to generate a first measurement value of the primary current.

In an embodiment, the measuring circuit may further comprise a high pass filter configured to adapt a level of the first measurement filter to an input voltage required by the timer module.

In an embodiment, the first measurement circuit portion comprises an H-bridge circuit connected to the excitation coil and to a voltage supply configured to output a PWM signal of the oscillating excitation current. The H-bridge circuit comprises a first pair of switches and a second pair of switches which are connected such that the first pair of switches is closed or open when the second pair of switches is open or closed respectively. The switches may advantageously be formed by MOSFET transistors.

In an embodiment, the first measurement signal is provided on a first output line connected at mid-points between the switches to a return line of the excitation coil, the first output line being connected to an input of a negative feedback operational amplifier that outputs said PWM signal.

In another embodiment, the first measurement circuit portion comprises a comparator with a bipolar voltage supply ($+V_C$, $-V_C$) connected at one input to a line of the excitation coil, an output of the comparator being connected to the other line of the excitation coil and in a feedback loop to a second input of the comparator, whereby the first measurement signal output is provided at the output of the comparator.

In an advantageous embodiment, the measuring circuit includes a second measurement circuit portion configured to generate, at a second measurement signal output of the second measurement circuit portion, the second measurement signal (S2) in the form of an analog signal of the excitation coil current ($I_{fluxgate}$).

In an embodiment, the second measurement circuit portion comprises a shunt resistance, a voltage across the shunt resistance forming the second measurement signal (S2).

In an embodiment, wherein the measuring circuit further comprises an analog to digital converter (ADC) connected to the second measurement signal output configured for converting the analog second measurement signal (S2) to a digital signal for processing in the signal processing unit to generate a second measurement value of the primary current.

In an embodiment, the first and second measurement circuit portions may be connected together through a connecting switch, the second measurement circuit portion comprising a comparator configured to open the switch when a value of the excitation current ($I_{fluxgate}$) reaches a predefined threshold value.

In an embodiment, the measuring circuit may further comprise a differential amplifier configured for conditioning the second measurement signal prior to the ADC conversion.

Further objects and advantageous aspects of the invention will be apparent from the claims, the following detailed description, and drawings in which:

Figure 5A:
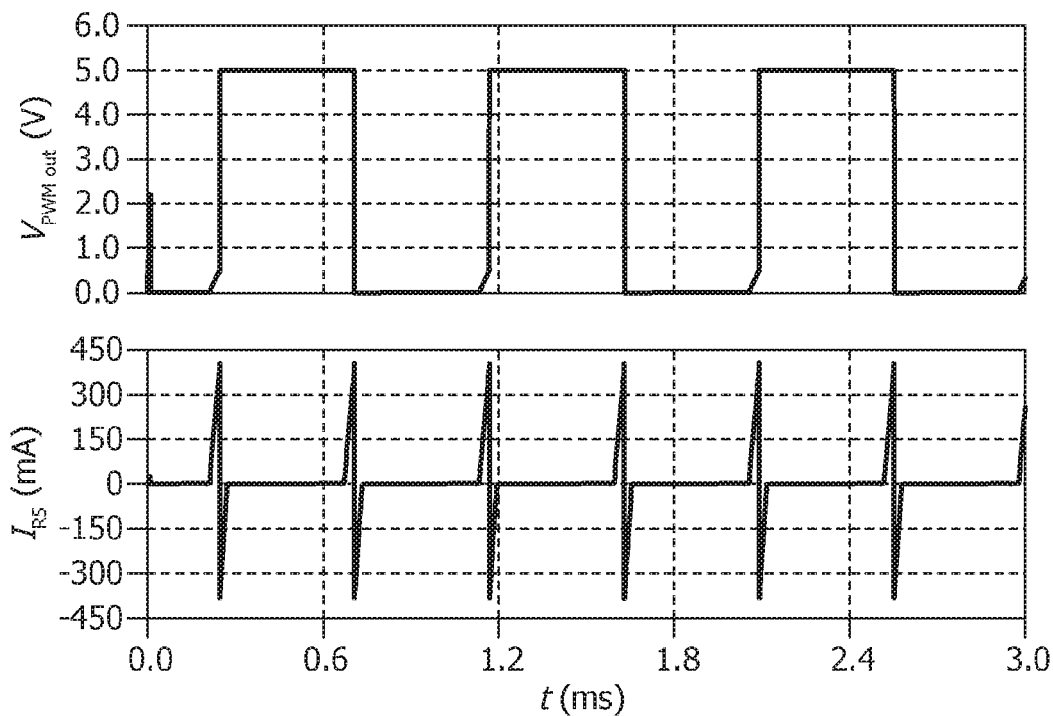
Figure 5B:
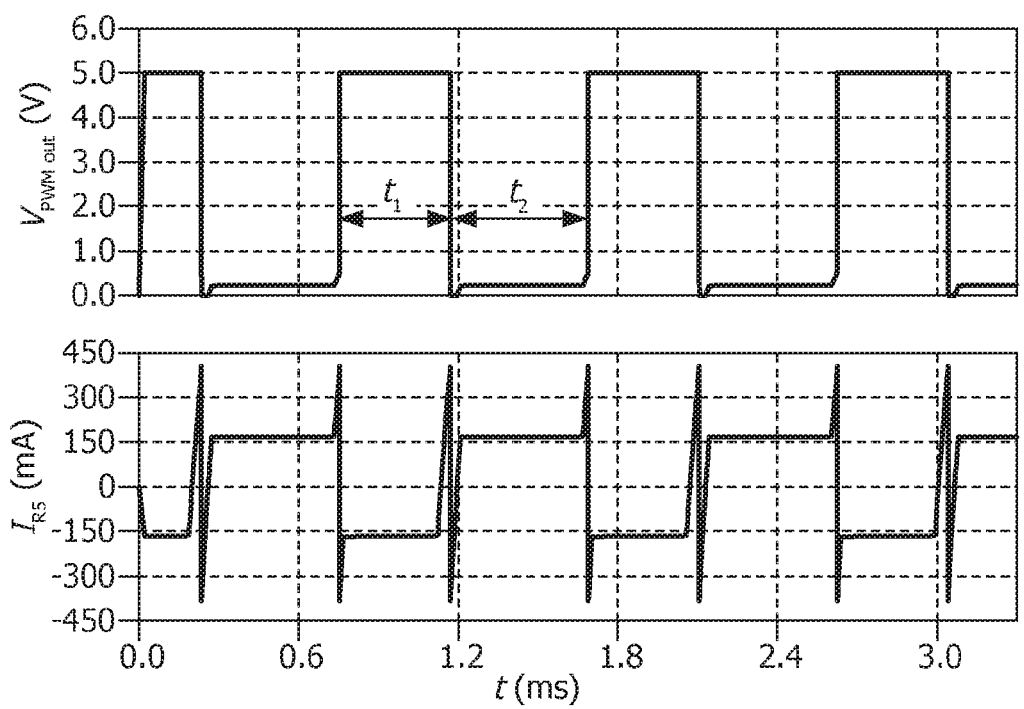
Figure 5C:
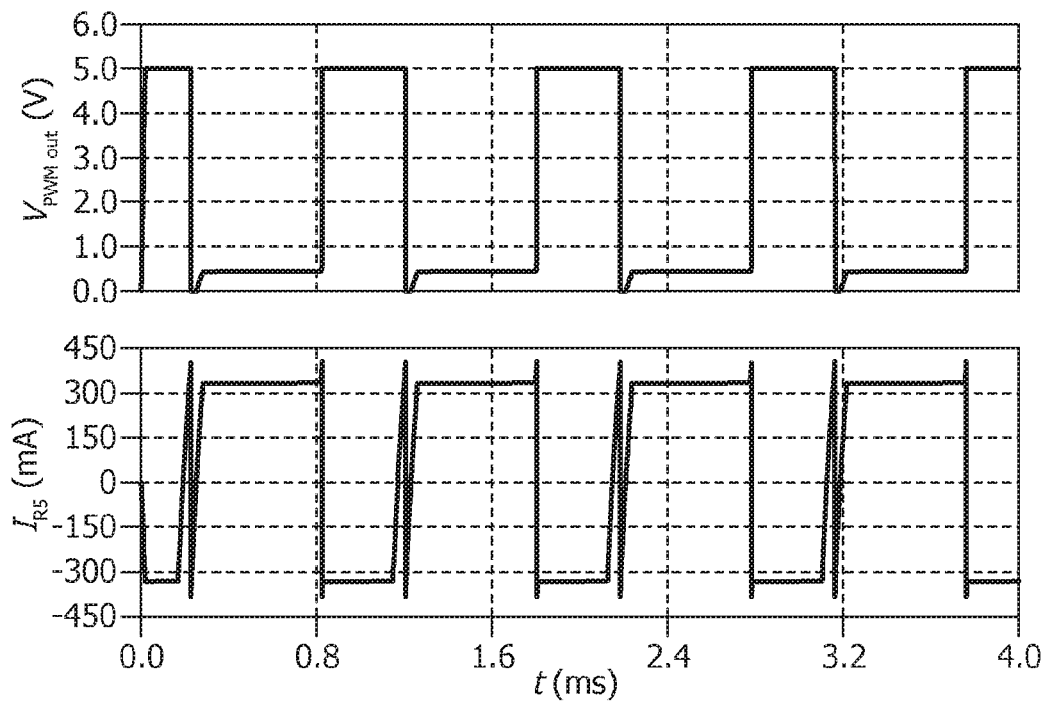
Figure 6:
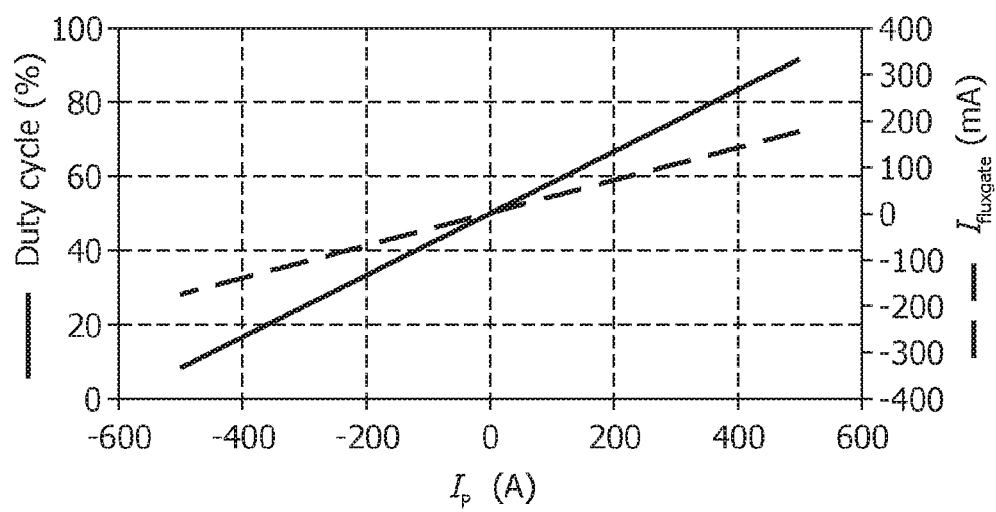

FIGS. 5a, 5b and 5c are graphs illustrating an excitation coil signal and an output pulse width modulation (PWM) signal of a current transducer according to embodiments of the inventions, where FIG. 5a shows an amplitude of the signal over time for a primary current of zero (nil) and FIGS. 5b, 5c for primary currents of 50% and 100% the specified maximum current for the current transducer; and FIG. 6 is a graph illustrating a relationship between the mean value of the coil current, PWM signal and primary current of a current transducer according to an embodiment of the invention.

Referring to the figures, a fluxgate based current transducer 2 for measuring a primary current comprises a fluxgate magnetic field detector 4 and a measuring circuit 6. The primary current may be a non-residual (non-"differential") current flowing in one or more primary conductors coupled to the transducer, or a residual ("differential") current flowing in two or more primary conductors coupled to the transducer. The fluxgate magnetic field detector comprises a saturable core made of a soft magnetic material and an excitation coil 14 wound around the saturable core. The excitation coil is driven by an oscillating current of a measuring circuit that is configured to alternatingly saturate the saturable core. The magnetic field of the primary current biases the magnetic field acting on the saturable core and thus modifies the excitation signal, the measurement of which provides an image of the primary current. The general configuration and working principle of fluxgate detectors are well known and shall therefore not be described in detail in the present application.

According to the invention, the measuring circuit 6 is configured to provide at least two different measurement signal outputs, including a first measurement output S1 and a second measurement output S2, of the primary current $I_P$ measured by the transducer.

The at least two measurement signal outputs are obtained from respective measurement signal paths, including a first measurement path P1 for the first measurement signal output, and a second measurement path P2 for the second measurement signal output, the different measurement signal paths being at least partially independent from one another.

The at least two measurement signal paths feed into a processing circuit 7 that processes the first and second measurement signal outputs. The processing of the measurement signal outputs provides a measurement of the primary current based on the first, or second, or both the first and second measurement signal outputs. The processing of the measurement signal outputs also verifies the correct functioning of the transducer by comparing the first and second measurement signal outputs. The two measurement signal outputs should provide a measurement value of the primary current that is the same, plus or minus a predefined acceptable tolerance value to account for normal measurement inaccuracies and differences between the two signal outputs. In a situation where the first and second measurement signal outputs provide respective measurement values of the primary current that differ by more than the predefined acceptable tolerance value, then an error signal is generated, for instance to signal the incorrect functioning of the transducer.

The first measurement signal path P1 comprises a first circuit portion 8 generating a digital type of signal of the oscillating excitation current $I_{fluxgate}$. In a preferred embodiment, the digital type of signal is a duty cycle signal of the oscillating excitation current $I_{fluxgate}$ that forms a pulse width modulated (PWM) signal. The PWM signal may be fed into a timer module, for instance in the form of an input capture circuit 20, per se well known in the art, that reads and captures values of the timing $t_1$, $t_2$ of the positive and negative PWM signal oscillations. A high pass filter, for instance an RC high pass filter (not shown), may be provided on the PWM output to adapt the output signal level to the input voltage specified for the timer module. As is per se well known in the art, the relative timing of the positive and negative PWM signal oscillations provides an image of the primary current being measured and may be converted into a first measurement value of the primary current that may be output by the transducer.

The second measurement signal path P2 comprises a second circuit portion 10 generating an analog type of signal of the oscillating excitation current $I_{fluxgate}$. The analog type of signal is fed into an analog to digital converter (ADC) 28 to convert the analog signal to a digital signal for processing in the processing circuit 7 to generate a second measurement value of the primary current that may be output by the transducer.

The measurement value of the primary current output by the current transducer may be based solely on the first measurement value, or based solely of the second measurement value, or based on a combination, for instance an average, of both the first and second measurement values.

The first and second measurement values are also compared in the processing circuit to determine their difference and a possible measurement error or malfunction of the transducer.

Figure 4:
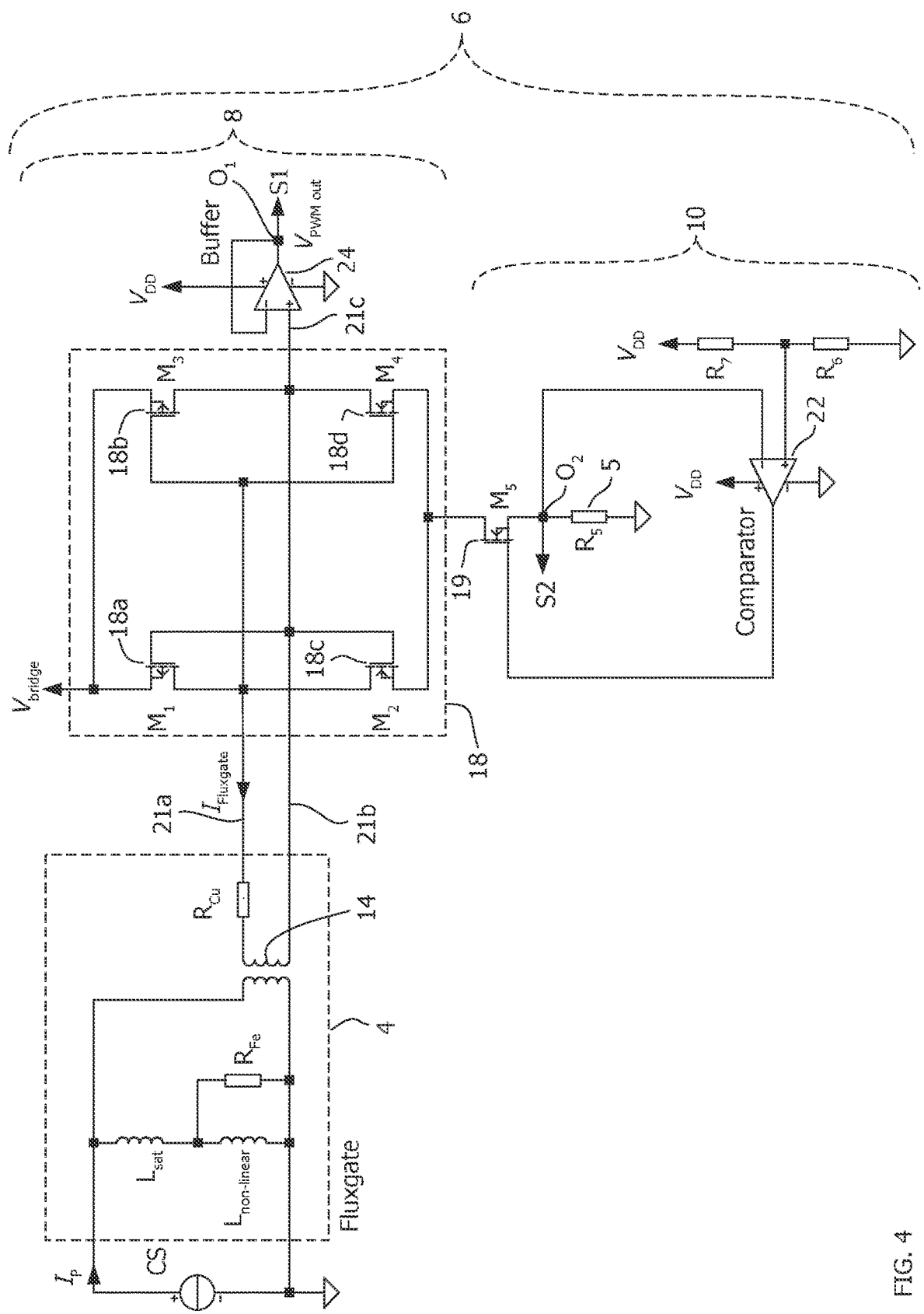
FIG. 4 is a circuit diagram of a current transducer according to another embodiment of this invention coupled to a primary conductor.

Referring to FIG. 4, according to an embodiment, the first measuring circuit portion 8 includes an H-bridge circuit 18 comprising four switches 18a, 18b, 18c, 18d. The H-bridge circuit 18 is connected to the excitation coil 14 of the fluxgate magnetic field detector 4, and to bi-directional voltage supply $V_{bridge}$ that supplies power to drive the H-bridge circuit and oscillating current $I_{fluxgate}$ of the excitation coil.

The H-bridge switches 18a, 18b, 18c, 18d are configured such that when the first pair of switches 18a, 18d are closed, the second pair of switches 18b, 18c are open, and when the first pair of switches 18a, 18d are open, the second pair of switches 18b, 18c are closed. As soon as the H-bridge circuit 18 is supplied with the bi-directional voltage supply, the excitation coil current $I_{fluxgate}$ starts flowing through the first or the second pair of switches.

In an advantageous embodiment, the switches may be in the form of MOSFET transistors.

The H-bridge circuit with MOSFET transistors is advantageous in that the circuit is not very sensitive to thermal and age related conditions that may create offset in other circuit types. The PWM signal output by the aforedescribed H-bridge circuit is thus robust and reliable over time and over a large range of operating temperatures, and the manufacturing of the transducer is simplified.

Nevertheless, within the scope of the invention, other transistors such as bipolar transistors may be used as switching elements.

A capacitor (not shown) may be placed in parallel to the bi-directional voltage supply in order to allow transfer of energy from the excitation coil 14 to the capacitor during short intervals of the oscillation cycle thereby reducing the power consumption of the circuit.

The PWM signal output is provided on a first output line 21c that is connected at the mid-point of the switches (18a and 18b, respectively 18c and 18d) to one of the lines 21a, 21b, —in particular the return line 21b—of the excitation coil 14. In an embodiment, the first output line 21c is connected to an input of a negative feedback operational amplifier 24 that outputs the PWM signal (S1, $V_{PWM\,out}$ in FIG. 2). The negative feedback operational amplifier 24 reduces electromagnetic interference between the PWM signal output and the excitation coil and H-bridge circuit.

The second measuring circuit portion 10 is connected to the first measuring circuit portion through a connecting switch 19. In an embodiment, the connecting switch may also be advantageously formed by a MOSFET transistor. The second measuring circuit portion 10 comprises a shunt resistor 5 connected to ground, whereby the voltage across the shunt resistor provides an analog output signal that is a rectified image of the oscillating current $I_{fluxgate}$ flowing through the fluxgate magnetic field detector 4 and thus of the primary current being measured.

In an embodiment, the second measuring circuit portion 10 may further comprise a comparator 22 having a first input connected to the first measuring circuit portion (in the present example the H-bridge) via the connecting switch 19, and a second input for receiving a predetermined threshold signal, for instance a constant threshold signal provided by a voltage source $V_{DD}$, directly or optionally through a voltage divider $R_7$, $R_6$. The output of the comparator 22 is configured to open the connecting switch 19 when the excitation coil current $I_{fluxgate}$ exceeds a threshold value causing a reverse flow of current to change the switching state of the two pairs of switches of the H-bridge circuit 18 to establish a new switching state.

Referring to FIGS. 5a, 5b and 5c, graphs illustrate excitation coil signals that vary according to the amplitude of the primary current being measured, where FIG. 5a shows an amplitude of the signal over time for a primary current of zero (nil) and FIGS. 5b, 5c for primary currents of 50% and 100% of the specified maximum current for the current transducer. The corresponding first measurement signal S1, in the form of pulse width modulation (PWM) signal, is also illustrated in each graph.

FIG. 6 illustrates the relationship between the coil current $I_{fluxgate}$, the duty cycle of signal S1 and the primary current $I_P$ measured by a current transducer according to embodiments of the invention.

Figure 2:
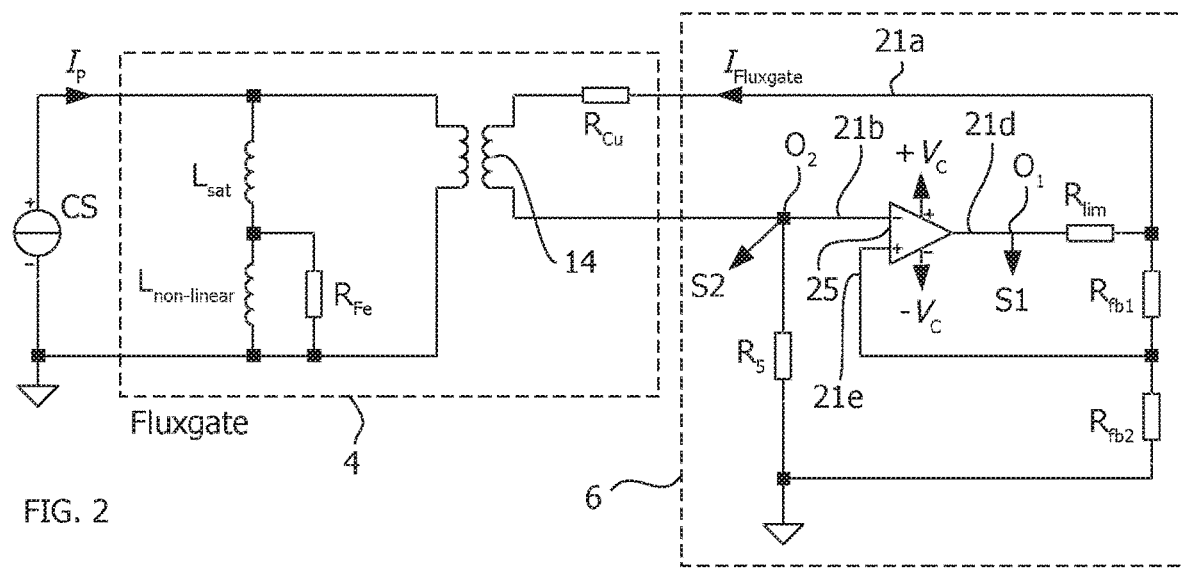
FIG. 2 is a circuit diagram of a current transducer according to an embodiment of this invention coupled to a primary conductor.

Referring to FIG. 2, according to another embodiment, the first measuring circuit portion 8 includes a comparator 25 with a bipolar voltage supply $+V_C$, $-V_C$ for a digital measurement of the excitation coil current $I_{fluxgate}$. An input of the comparator is connected to one of the lines 21a, 21b, in particular the return line 21b—of the excitation coil 14. The output 21d of the comparator is connected to the other line of the excitation coil 14, in particular the feed line 21a, and in a feedback loop to the other input 21e of the comparator 25, via a voltage divider $R_{fb1}$, $R_{fb2}$ connected to ground. The comparator 25 with bipolar supply is configured to generate a digital type of signal, corresponding to a duty cycle signal of the oscillating excitation current $I_{fluxgate}$, in the form of a pulse width modulated (PWM) signal. The PWM signal is provided at the output of the comparator, and may be fed into the input capture circuit 20 as previously described.

Figure 3:
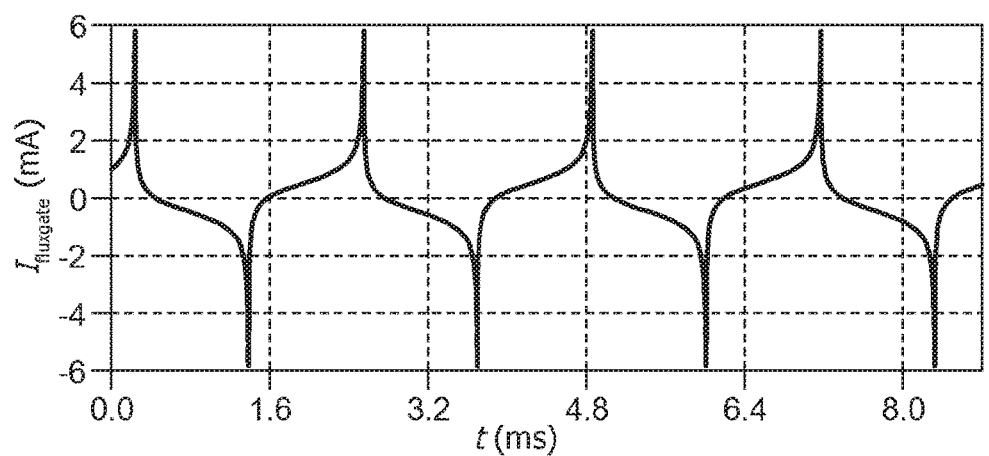
FIG. 3 is a graph illustrating the analog coil excitation current as a function of time, for a fluxgate transducer with a bipolar supply according to an embodiment of the invention.

In the embodiment according to FIG. 2, the second measuring circuit portion 10 is connected to one of the lines 21a, 21b, —in particular the return line 21b—of the excitation coil 14. The second measuring circuit portion 10 comprises a shunt resistor $R_5$ connected to ground, whereby the voltage across the shunt resistor provides an analog output signal that is an image of the oscillating excitation current $I_{fluxgate}$ flowing through the fluxgate magnetic field detector 4 and thus of the primary current being measured. FIG. 3 illustrates the analog coil excitation current $I_{fluxgate}$ as a function of time, for the fluxgate transducer with bipolar supply according to the embodiment of FIG. 2.

Figure 1:
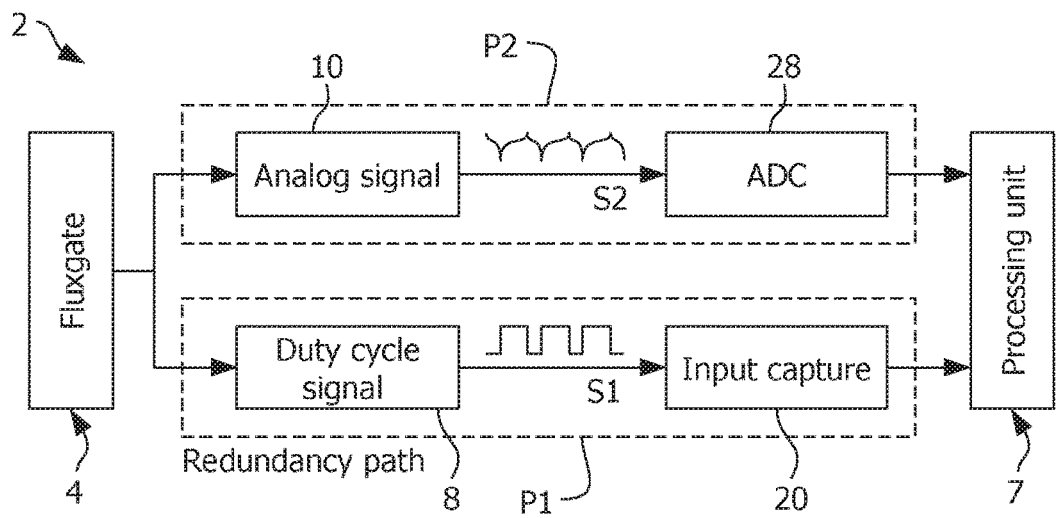
FIG. 1 is a simplified schematic block diagram of a current transducer according to the invention.

Referring to FIG. 1, the second measurement signal path P2 comprises an analog to digital converter (ADC) 28 connected to the output of the second measuring circuit portion 10 for conditioning the signal for use in the digital processing circuit 7. The second measuring circuit portion 10 may further comprise a differential amplifier (not shown) prior to the analog-to-digital conversion.

The outputs of the ADC converter 28 and the input capture circuit 20 are connected to the signal processing unit 7 which is configured to compare the aforesaid two separate outputs in real-time. The signal output processing unit is configured to send an error signal output if the difference between said first and second outputs exceeds a predefined tolerance value. FIG. 1 illustrates the functional separation of the first and second measurement paths P1, P2, however it may be noted that the ADC 28 and the timer module 20 may be physically incorporated in the processing unit 7.

Advantageously, the provision of two signal paths providing two measurement signal outputs S1, S2 that are at least partially independent from each other and based on different measurement principles, allows to detect a malfunctioning of the transducer by comparing the two measurement signals. If the transducer is defective, the fault leading to an erroneous measurement signal may not be noticed by only one of the output signals, however because the measurement signal follows different measurement paths P1, P2 working according to different measurement principles (one being of an essentially analog type and the other of an essentially digital type), the different signal processing of a fault along the two paths would cause different measurement signal outputs that may be detected by comparing the two signals. The fluxgate based current transducer according to the invention thus provides accurate and reliable measurements and advantageously detects inaccurate or faulty measurements outputs of a defective transducer in a cost effective manner.

The invention claimed is:

1. Fluxgate based current transducer for measuring a primary current $I_P$, comprising a fluxgate magnetic field detector, a measuring circuit, and a signal output processing unit, the fluxgate magnetic field detector including an excitation coil driven by an oscillating excitation current ($I_{fluxgate}$) supplied by the measuring circuit, wherein the measuring circuit is configured to provide at least two different measurement signals of the primary current ($I_P$), including a first measurement signal obtained through a first measurement signal path and a second measurement signal obtained through a second measurement signal path, the first and second measurement signal paths connected to the signal processing unit configured to compare in real time the first and second measurement signals and to output an error signal if the difference between said first and second measurement signals exceeds a predefined tolerance value.

2. The transducer according to claim 1, wherein the measuring circuit includes a first measurement circuit portion configured to generate, at a first measurement signal output of the first measurement circuit portion, the first measurement signal in the form of a pulse width modulated (PWM) signal of the excitation coil current ($I_{fluxgate}$).

3. The transducer according to claim 2, including a timer module configured to read and capture values of timing of positive and negative PWM signal oscillations for processing in the signal processing unit to generate a first measurement value of the primary current.

4. The transducer according to claim 3, wherein the measuring circuit further comprises a high pass filter configured to adapt a level of the first measurement signal to an input voltage required by the timer module.

5. The transducer according to claim 2, wherein the first measurement circuit portion comprises an H-bridge circuit connected to the excitation coil and to a voltage supply configured to output the PWM signal of the oscillating current ($I_{fluxgate}$), the H-bridge circuit comprising a first pair of switches and a second pair of switches which are connected such that the first pair of switches is closed or open when the second pair of switches is open or closed respectively.

6. The transducer according to claim 5, wherein said switches are formed by MOSFET transistors.

7. The transducer according to claim 5, wherein the first measurement signal is provided on a first output line connected at mid-points between the switches to a return line of the excitation coil, the first output line being connected to an input of a negative feedback operational amplifier that outputs said PWM signal.

8. The transducer according to claim 2, wherein the first measurement circuit portion comprises a comparator with a bipolar voltage supply connected at one input to a line of the excitation coil, an output of the comparator being connected to the other line of the excitation coil and in a feedback loop to a second input of the comparator, whereby the first measurement signal output is provided at the output of the comparator.

9. The transducer according to claim 1, wherein the measuring circuit includes a second measurement circuit portion configured to generate at a second measurement signal output of the second measurement circuit portion, the second measurement signal in the form of an analog signal of the excitation coil current ($I_{fluxgate}$).

10. The transducer according to claim 9, wherein the second measurement circuit portion comprises a shunt resistance, a voltage across the shunt resistance forming the second measurement signal.

11. The transducer according to claim 9, wherein the measuring circuit further comprises an analog to digital converter (ADC) connected to the second measurement signal output configured for converting the analog second measurement signal to a digital signal for processing in the signal processing unit to generate a second measurement value of the primary current.

12. The transducer according to claim 11, further comprising a differential amplifier configured for conditioning the second measurement signal prior to the ADC conversion.

13. Fluxgate based current transducer for measuring a primary current $I_P$, comprising a fluxgate magnetic field detector, a measuring circuit, and a signal output processing unit, the fluxgate magnetic field detector including an excitation coil driven by an oscillating excitation current ($I_{fluxgate}$) supplied by the measuring circuit, wherein the measuring circuit is configured to provide at least two different measurement signals of the primary current ($I_P$), including a first measurement signal obtained through a first measurement signal path and a second measurement signal obtained through a second measurement signal path, the first and second measurement signal paths connected to the signal processing unit configured to compare in real time the first and second measurement signals and to output an error signal if the difference between said first and second measurement signals exceeds a predefined tolerance value, wherein the measuring circuit includes a first measurement circuit portion configured to generate, at a first measurement signal output of the first measurement circuit portion, the first measurement signal in the form of a pulse width modulated (PWM) signal of the excitation coil current ($I_{fluxgate}$) and the measuring circuit includes a second measurement circuit portion configured to generate, at a second measurement signal output of the second measurement circuit portion, the second measurement signal in the form of an analog signal of the excitation coil current ($I_{fluxgate}$) and wherein the first and second measurement circuit portions are connected together through a connecting switch, the second measurement circuit portion comprising a comparator configured to open the switch when a value of the excitation current ($I_{fluxgate}$) reaches a predefined threshold value.

14. The transducer according to claim 13, including a timer module configured to read and capture values of timing of positive and negative PWM signal oscillations for processing in the signal processing unit to generate a first measurement value of the primary current.

15. The transducer according to claim 14, wherein the measuring circuit further comprises a high pass filter configured to adapt a level of the first measurement signal to an input voltage required by the timer module.

16. The transducer according to claim 13, wherein the first measurement circuit portion comprises an H-bridge circuit connected to the excitation coil and to a voltage supply configured to output the PWM signal of the oscillating current ($I_{fluxgate}$), the H-bridge circuit comprising a first pair of switches and a second pair of switches which are connected such that the first pair of switches is closed or open when the second pair of switches is open or closed respectively.

17. The transducer according to claim 16, wherein said switches are formed by MOSFET transistors.

18. The transducer according to claim 16, wherein the first measurement signal is provided on a first output line connected at mid-points between the switches to a return line of the excitation coil, the first output line being connected to an input of a negative feedback operational amplifier that outputs said PWM signal.

19. The transducer according to claim 13, wherein the second measurement circuit portion comprises a shunt resistance, a voltage across the shunt resistance forming the second measurement signal.

20. The transducer according to claim 13, wherein the measuring circuit further comprises an analog to digital converter (ADC) connected to the second measurement signal output configured for converting the analog second measurement signal to a digital signal for processing in the signal processing unit to generate a second measurement value of the primary current.

21. The transducer according to claim 20, further comprising a differential amplifier configured for conditioning the second measurement signal prior to the ADC conversion.

\* \* \* \* \*